(12) United States Patent
Bowling

(10) Patent No.: US 6,937,084 B2
(45) Date of Patent: Aug. 30, 2005

(54) PROCESSOR WITH DUAL-DEADTIME PULSE WIDTH MODULATION GENERATOR

(75) Inventor: Stephen A. Bowling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 995 days.

(21) Appl. No.: 09/870,626

(22) Filed: Jun. 1, 2001

(65) Prior Publication Data

US 2002/0184469 A1 Dec. 5, 2002

(51) Int. Cl.$^7$ .............................................. H03K 17/296
(52) U.S. Cl. ...................................... 327/393; 327/172
(58) Field of Search ................................ 327/392–393, 327/396, 398, 401, 170–172, 175

(56) References Cited

U.S. PATENT DOCUMENTS

| | | | |
|---|---|---|---|
| 3,771,146 A | 11/1973 | Cotton et al. ................ | 710/260 |
| 3,781,810 A | 12/1973 | Downing .................... | 712/228 |
| 3,886,524 A | 5/1975 | Appeit ........................ | 710/110 |
| 3,930,253 A | 12/1975 | Maida ......................... | 340/347 |
| 4,025,771 A | 5/1977 | Lynch et al. ................ | 708/521 |
| 4,074,353 A | 2/1978 | Woods et al. ................ | 710/264 |
| 4,090,250 A | 5/1978 | Carlson et al. ............. | 712/234 |
| 4,323,981 A | 4/1982 | Nakamura ................... | 364/749 |
| 4,379,338 A | 4/1983 | Nishitani et al. ........... | 708/552 |
| 4,398,244 A | 8/1983 | Chu et al. .................... | 712/244 |
| 4,408,274 A | 10/1983 | Wheatley et al. ........... | 364/200 |
| 4,451,885 A | 5/1984 | Gerson et al. .............. | 708/200 |
| 4,472,788 A | 9/1984 | Yamazaki .................... | 708/209 |
| 4,481,576 A | 11/1984 | Bicknell ..................... | 711/217 |
| 4,488,252 A | 12/1984 | Vassar ......................... | 708/505 |
| 4,511,990 A | 4/1985 | Hagiwara et al. ........... | 708/501 |
| 4,556,938 A | 12/1985 | Parker et al. ............... | 712/241 |
| 4,615,005 A | 9/1986 | Maejima et al. ............. | 713/601 |

(Continued)

FOREIGN PATENT DOCUMENTS

| | | | |
|---|---|---|---|
| EP | 0 554 917 A2 | 8/1993 | ............. G06F/9/26 |
| EP | 0 855 643 A1 | 7/1998 | ............. G06F/9/30 |
| EP | 0 992 888 | 12/2000 | ............. G06F/9/32 |
| EP | 0 992 889 | 12/2000 | ............. G06F/9/32 |
| JP | 01037424 A | 2/1989 | ............. H03M/1/82 |
| WO | 96/11443 | 4/1996 | ............ G06F/15/78 |

OTHER PUBLICATIONS

SPARC, International, Inc., "The SPARC Architecture Manual", Version 8, pp 1–303, 1992.

(Continued)

Primary Examiner—Timothy P. Callahan
Assistant Examiner—Cassandra Cox
(74) Attorney, Agent, or Firm—Baker Botts L.L.P.

(57) ABSTRACT

A processor that has pulse width modulation generation circuitry that provides an improved ability to deal with the less than perfect switching characteristics of external switching devices that are connected to PWM hardware included in a processor. Complementary PWM output signals have dual deadtime delay in which the delay between the inactivation of the first signal and the activation of the second signal may be different than the delay between the inactivation of the second signal and the activation of the first signal. This provides an improved capability to deal with non-symmetric switching characteristics of the external switching devices, and the circuitry to which they are connected. The dual deadtime pulse width modulation generator for a processor includes deadtime generation circuitry operable to generate a first pulse width modulated signal and a second pulse width modulated signal complementary to the first pulse width modulated signal, wherein there is a first delay between inactivation of the first pulse width modulated signal and activation of the second pulse width modulated signal, a second delay between inactivation of the second pulse width modulated signal and activation of the first pulse width modulated signal, and the first and second delays are not equal. The first delay and the second delay may be independently settable.

16 Claims, 6 Drawing Sheets

U.S. PATENT DOCUMENTS

| | | |
|---|---|---|
| 4,626,988 A | 12/1986 | George .................... 712/241 |
| 4,709,324 A | 11/1987 | Kloker ..................... 364/200 |
| 4,730,248 A | 3/1988 | Watanabe et al. ........... 712/228 |
| 4,742,479 A | 5/1988 | Kloker et al. .............. 364/746 |
| 4,768,149 A | 8/1988 | Konopik et al. ............ 364/200 |
| 4,779,191 A | 10/1988 | Greenblatt ................. 711/2 |
| 4,782,457 A | 11/1988 | Cline ...................... 708/205 |
| 4,800,524 A | 1/1989 | Roesgen .................... 364/900 |
| 4,807,172 A | 2/1989 | Nukiyama ................... 708/209 |
| 4,829,420 A | 5/1989 | Stahle ..................... 711/200 |
| 4,829,460 A | 5/1989 | Ito ........................ 708/209 |
| 4,839,846 A | 6/1989 | Hirose et al. .............. 708/497 |
| 4,841,468 A | 6/1989 | Miller et al. .............. 708/625 |
| 4,872,128 A | 10/1989 | Shimizu .................... 708/209 |
| 4,882,701 A | 11/1989 | Ishii ...................... 712/241 |
| 4,926,371 A | 5/1990 | Vassiliadis et al. ......... 708/628 |
| 4,941,120 A | 7/1990 | Brown et al. ............... 708/497 |
| 4,943,940 A | 7/1990 | New ........................ 708/507 |
| 4,945,507 A | 7/1990 | Ishida et al. .............. 708/530 |
| 4,959,776 A | 9/1990 | Deerfield et al. ........... 711/217 |
| 4,977,533 A | 12/1990 | Miyabayashi et al. ......... 708/404 |
| 4,984,213 A | 1/1991 | Abdoo et al. ............ 365/230.05 |
| 5,007,020 A | 4/1991 | Inskeep .................... 711/200 |
| 5,012,441 A | 4/1991 | Retter ..................... 711/217 |
| 5,032,986 A | 7/1991 | Pathak et al. .............. 711/217 |
| 5,034,887 A | 7/1991 | Yasui et al. ............... 364/200 |
| 5,038,310 A | 8/1991 | Akagiri et al. ............. 708/205 |
| 5,040,178 A | 8/1991 | Lindsay et al. ............. 371/21.5 |
| 5,056,004 A | 10/1991 | Ohde et al. ................ 712/241 |
| 5,099,445 A | 3/1992 | Studor et al. .............. 708/209 |
| 5,101,484 A | 3/1992 | Kohn ....................... 712/241 |
| 5,117,498 A | 5/1992 | Miller et al. .............. 712/241 |
| 5,121,431 A | 6/1992 | Wiener ..................... 713/174 |
| 5,122,981 A | 6/1992 | Taniguchi .................. 708/497 |
| 5,155,823 A | 10/1992 | Tsue ....................... 711/217 |
| 5,177,373 A | 1/1993 | Nakamura ................... 307/265 |
| 5,197,023 A | 3/1993 | Nakayama ................... 708/505 |
| 5,197,140 A | 3/1993 | Balmer ..................... 711/220 |
| 5,206,940 A | 4/1993 | Murakami et al. ............ 711/218 |
| 5,212,662 A | 5/1993 | Cocanougher et al. ......... 708/508 |
| 5,239,654 A | 8/1993 | Ing-Simmons et al. ......... 395/800 |
| 5,276,634 A | 1/1994 | Suzuki et al. .............. 708/497 |
| 5,282,153 A | 1/1994 | Bartkowiak et al. .......... 708/243 |
| 5,327,543 A | 7/1994 | Miura et al. ............... 712/224 |
| 5,327,566 A | 7/1994 | Forsyth .................... 710/260 |
| 5,375,080 A | 12/1994 | Davies ..................... 364/736.5 |
| 5,379,240 A | 1/1995 | Byrne ...................... 708/209 |
| 5,386,563 A | 1/1995 | Thomas ..................... 395/650 |
| 5,392,435 A | 2/1995 | Masui et al. ............... 395/725 |
| 5,418,976 A | 5/1995 | Iida ....................... 395/800 |
| 5,422,805 A | 6/1995 | McIntyre et al. ............ 708/625 |
| 5,432,943 A | 7/1995 | Mitsuishi .................. 395/725 |
| 5,448,703 A | 9/1995 | Amini et al. ............... 710/110 |
| 5,448,706 A | 9/1995 | Fleming et al. ............. 711/217 |
| 5,450,027 A | 9/1995 | Gabara ..................... 326/98 |
| 5,463,749 A | 10/1995 | Wertheizer et al. .......... 711/110 |
| 5,469,377 A | 11/1995 | Amano ...................... 708/497 |
| 5,471,600 A | 11/1995 | Nakamoto ................... 711/5 |
| 5,497,340 A | 3/1996 | Uramoto et al. ............. 708/552 |
| 5,499,380 A | 3/1996 | Iwata et al. ............... 711/212 |
| 5,504,916 A | 4/1996 | Murakami et al. ............ 395/800 |
| 5,506,484 A * | 4/1996 | Munro et al. ............... 318/599 |
| 5,517,436 A | 5/1996 | Andreas et al. ............. 364/736 |
| 5,525,874 A | 6/1996 | Mallarapu et al. ........... 318/254 |
| 5,548,544 A | 8/1996 | Matheny et al. ............. 708/497 |
| 5,561,384 A | 10/1996 | Reents et al. .............. 327/108 |
| 5,561,619 A | 10/1996 | Watanabe et al. ............ 364/736.5 |
| 5,564,028 A | 10/1996 | Swoboda et al. ............. 395/375 |
| 5,568,380 A | 10/1996 | Brodnax et al. ............. 364/184 |
| 5,568,412 A | 10/1996 | Han et al. ................. 708/497 |
| 5,596,760 A | 1/1997 | Ueda ....................... 712/241 |
| 5,600,813 A | 2/1997 | Nakagawa et al. ............ 711/217 |
| 5,611,061 A | 3/1997 | Yasuda ..................... 395/591 |
| 5,619,711 A | 4/1997 | Anderson ................... 712/221 |
| 5,623,646 A | 4/1997 | Clarke ..................... 395/560 |
| 5,638,524 A | 6/1997 | Kiuchi et al. .............. 395/375 |
| 5,642,516 A | 6/1997 | Hedayat et al. ............. 710/260 |
| 5,649,146 A | 7/1997 | Riou ....................... 395/421.07 |
| 5,651,121 A | 7/1997 | Davies ..................... 395/376 |
| 5,657,484 A | 8/1997 | Scarra ..................... 395/561 |
| 5,659,700 A | 8/1997 | Chen et al. ................ 395/421.07 |
| 5,682,339 A | 10/1997 | Tam ........................ 364/715.08 |
| 5,689,693 A | 11/1997 | White ...................... 712/224 |
| 5,694,350 A | 12/1997 | Wolrich et al. ............. 708/497 |
| 5,696,711 A | 12/1997 | Makineni ................... 708/497 |
| 5,701,493 A | 12/1997 | Jaggar ..................... 395/734 |
| 5,706,460 A | 1/1998 | Craig et al. ............... 712/204 |
| 5,706,466 A | 1/1998 | Dockser .................... 395/452 |
| 5,715,470 A | 2/1998 | Asano et al. ............... 375/341 |
| 5,737,570 A | 4/1998 | Koch ....................... 711/149 |
| 5,740,095 A | 4/1998 | Parant ..................... 364/760 |
| 5,740,419 A | 4/1998 | Potter ..................... 712/241 |
| 5,740,451 A | 4/1998 | Muraki et al. .............. 395/733 |
| 5,748,516 A | 5/1998 | Goddard et al. ............. 708/497 |
| 5,748,970 A | 5/1998 | Miyaji et al. .............. 395/733 |
| 5,764,555 A | 6/1998 | McPherson et al. ........... 708/497 |
| 5,765,216 A | 6/1998 | Weng et al. ................ 711/214 |
| 5,765,218 A | 6/1998 | Ozawa et al. ............... 711/219 |
| 5,774,711 A | 6/1998 | Henry et al. ............... 712/244 |
| 5,778,237 A | 7/1998 | Yamamoto et al. ............ 713/322 |
| 5,778,416 A | 7/1998 | Harrison et al. ............ 711/5 |
| 5,790,443 A | 8/1998 | Shen et al. ................ 708/491 |
| 5,808,926 A | 9/1998 | Gorshtein et al. ........... 708/505 |
| 5,812,439 A | 9/1998 | Hansen ..................... 708/497 |
| 5,812,868 A | 9/1998 | Moyer et al. ............... 395/800.23 |
| 5,815,693 A | 9/1998 | McDermott et al. ........... 713/501 |
| 5,825,730 A | 10/1998 | Nishida et al. ............. 369/44.32 |
| 5,826,072 A | 10/1998 | Knapp et al. ............... 395/567 |
| 5,826,096 A | 10/1998 | Baxter ..................... 712/24 |
| 5,828,875 A | 10/1998 | Halvarsson et al. .......... 712/241 |
| 5,862,065 A | 1/1999 | Muthusamy ................... 708/521 |
| 5,867,726 A | 2/1999 | Ohsuga et al. .............. 395/800.32 |
| 5,875,342 A | 2/1999 | Temple ..................... 395/733 |
| 5,880,984 A | 3/1999 | Burchfiel et al. ........... 708/501 |
| 5,892,697 A | 4/1999 | Brakefield ................. 708/496 |
| 5,892,699 A | 4/1999 | Duncan et al. .............. 708/628 |
| 5,894,428 A | 4/1999 | Harada ..................... 708/306 |
| 5,900,683 A | 5/1999 | Rinehart et al. ............ 307/126 |
| 5,909,385 A | 6/1999 | Nishiyama et al. ........... 708/630 |
| 5,917,741 A | 6/1999 | Ng ......................... 708/497 |
| 5,918,252 A | 6/1999 | Chen et al. ................ 711/217 |
| 5,930,159 A | 7/1999 | Wong ....................... 708/550 |
| 5,930,503 A | 7/1999 | Drees ...................... 713/1 |
| 5,936,870 A | 8/1999 | Im ......................... 364/745.03 |
| 5,937,199 A | 8/1999 | Temple ..................... 395/335 |
| 5,938,759 A | 8/1999 | Kamijo ..................... 712/209 |
| 5,941,940 A | 8/1999 | Prasad et al. .............. 708/523 |
| 5,943,249 A | 8/1999 | Handlogten ................. 708/496 |
| 5,944,816 A | 8/1999 | Dutton et al. .............. 712/215 |
| 5,951,627 A | 9/1999 | Kiamilev et al. ............ 708/404 |
| 5,951,679 A | 9/1999 | Anderson et al. ............ 712/241 |
| 5,973,527 A * | 10/1999 | Schweighofer et al. ........ 327/172 |
| 5,974,549 A | 10/1999 | Golan ...................... 713/200 |
| 5,978,825 A | 11/1999 | Divine et al. .............. 708/525 |
| 5,983,333 A | 11/1999 | Kolagotia et al. ........... 711/219 |
| 5,991,787 A | 11/1999 | Abel et al. ................ 708/400 |
| 5,991,868 A | 11/1999 | Kamiyama et al. ............ 712/32 |
| 5,996,067 A | 11/1999 | White ...................... 712/224 |
| 6,002,234 A * | 12/1999 | Ohm et al. ................. 318/729 |
| 6,009,454 A | 12/1999 | Dummermuth ................. 718/108 |
| 6,014,723 A | 1/2000 | Tremblay et al. ............ 711/1 |

| | | | |
|---|---|---|---|
| 6,018,757 A | 1/2000 | Wong | 708/525 |
| 6,026,489 A | 2/2000 | Wachi et al. | 712/241 |
| 6,044,392 A | 3/2000 | Anderson et al. | 708/551 |
| 6,044,434 A | 3/2000 | Oliver | 711/110 |
| 6,049,858 A | 4/2000 | Kolagotla et al. | 711/217 |
| 6,055,619 A | 4/2000 | North et al. | 713/36 |
| 6,058,409 A | 5/2000 | Kozaki et al. | 708/409 |
| 6,058,410 A | 5/2000 | Sharangpani | 708/551 |
| 6,058,464 A | 5/2000 | Taylor | 711/217 |
| 6,061,711 A | 5/2000 | Song et al. | 709/108 |
| 6,061,780 A | 5/2000 | Shippey et al. | 712/204 |
| 6,061,783 A | 5/2000 | Harriman | 712/224 |
| 6,076,154 A | 6/2000 | Van Eijndhoven et al. | 712/24 |
| 6,084,880 A | 7/2000 | Bailey et al. | 370/395 |
| 6,101,521 A | 8/2000 | Kosiec | 708/550 |
| 6,101,599 A | 8/2000 | Wright et al. | 712/228 |
| 6,115,732 A | 9/2000 | Oberman et al. | 708/625 |
| 6,128,728 A | 10/2000 | Dowling | 712/228 |
| 6,134,574 A | 10/2000 | Oberman et al. | 708/551 |
| 6,144,980 A | 11/2000 | Oberman | 708/627 |
| 6,145,049 A | 11/2000 | Wong | 710/267 |
| 6,181,151 B1 | 1/2001 | Wasson | 324/765 |
| 6,202,163 B1 | 3/2001 | Gabzdyl et al. | 713/324 |
| 6,205,467 B1 | 3/2001 | Lambrecht et al. | 709/108 |
| 6,209,086 B1 | 3/2001 | Chi et al. | 712/244 |
| 6,243,786 B1 | 6/2001 | Huang et al. | 710/264 |
| 6,243,804 B1 | 6/2001 | Cheng | 712/228 |
| 6,260,162 B1 | 7/2001 | Typaldos et al. | 714/55 |
| 6,282,637 B1 | 8/2001 | Chan et al. | 712/223 |
| 6,292,866 B1 | 9/2001 | Zaiki et al. | 710/264 |
| 6,295,574 B1 | 9/2001 | MacDonald | 710/261 |
| 6,315,200 B1 | 11/2001 | Silverbrook et al. | 235/454 |
| 6,356,970 B1 | 3/2002 | Killian et al. | 710/269 |
| 6,377,619 B1 | 4/2002 | Denk et al. | 375/232 |
| 6,397,318 B1 | 5/2002 | Peh | 711/220 |
| 6,412,081 B1 | 6/2002 | Koscal et al. | 714/34 |
| 6,434,020 B1 * | 8/2002 | Lambert et al. | 363/17 |
| 6,487,654 B2 | 11/2002 | Dowling | 712/244 |
| 6,523,108 B1 | 2/2003 | James et al. | 712/224 |
| 6,552,625 B2 * | 4/2003 | Bowling | 332/109 |
| 6,564,238 B1 | 5/2003 | Kim et al. | 708/513 |
| 6,633,970 B1 | 10/2003 | Clift et al. | 712/217 |
| 6,643,150 B2 * | 11/2003 | Kawakami | 363/41 |
| 6,658,578 B1 | 12/2003 | Laurenti et al. | 713/324 |
| 6,681,280 B1 | 1/2004 | Miyake et al. | 710/261 |
| 6,694,398 B1 | 2/2004 | Zhao et al. | 710/260 |
| 6,724,169 B2 * | 4/2004 | Majumdar et al. | 318/811 |
| 6,728,856 B2 | 4/2004 | Grosbach et al. | 711/202 |
| 6,751,742 B1 | 6/2004 | Duhault et al. | 713/323 |
| 6,763,478 B1 | 7/2004 | Bui | 713/600 |
| 2002/0194466 A1 | 12/2002 | Catherwood et al. | 712/241 |
| 2003/0093656 A1 | 5/2003 | Masse et al. | 712/241 |
| 2004/0150439 A1 * | 8/2004 | Greenfeld | 327/131 |

OTHER PUBLICATIONS

Moon B I et al.: "A 32–bit RISC Microprocessor with DSP Functionality: Rapid Prototyping" IEICE Transactions on Fundamentals of Electronics, Communications and Computer Sciences, Institute of Electronics Information and Comm. Eng. Tokyo, JP, vol. E84–A No. 5, pp. 1339–1347, XP001060025 ISSN: 0916–8508, May 2001.

Turley J: "Balancing Conflicting Requirements When Mixing RISC, DSPs" Computer Design, Pennwell Publ. Littleton, Massachusetts, IS, vol. 37, No. 10, pp. 46, 48, 50–53, XP000860706 ISSN:0010–4566, Oct. 1998.

Levy M: "Microprocessor and DSP Technologies Unite for Embedded Applications" EDN Electrical Design News, Cahners Publishing Co., Newtown Massachusetts, US, No. Europe, pp. 73–74, 76, 78–80, XP000779113 ISSN: 0012–7515, Mar. 2, 1998.

Intel, Pentium Processor Family Developer's Manual, vol. 3: Architrecture and Programming Manual,, pp. 3–1, 3–2, 3–15, 14–1 to 14–30, 18–7, and 25–289 to 25–292, 1995.

Intel, Embedded Intel486 Processor Family Developer's Manual, pp. 2–2, 3–17, 3–37, 4–5, 4–6, 10–1 to 10–12, 12–1 to 12–10, Oct. 1997.

Moore, M "Z80 Family Interrupt Structure". Barleywood (online), retrieved from the internet <URL: http://www.gaby.de/z80/1653.htm>, 1997.

PCT Search Report based on PCT/US02/16706, 6 pages, Mailed Sep. 27, 2002.

PCT Search Report based on PCT/US02/16705, 7 pages, Mailed Sep. 9, 2002.

PCT Search Report based on PCT/US02/16921, 4 pages Mailed Oct. 18, 2002.

* cited by examiner

PROCESSOR WITH DUAL-DEADTIME PULSE WIDTH MODULATION GENERATOR

FIELD OF THE INVENTION

The present invention relates to a processor having a pulse width modulation (PWM) generator that generates deadtime delays in which the delay from the inactivation of a first signal to the activation of a second signal may be different than the delay from the inactivation of the second signal to the activation of the first signal.

BACKGROUND OF THE INVENTION

Processors, including microprocessors, digital signal processors and microcontrollers, operate by running software programs that are embodied in one or more series of program instructions stored in a memory. The processors run the software by fetching the program instructions from the series of program instructions, decoding the program instructions and executing them. In addition to program instructions, data is also stored in memory that is accessible by the processor. Generally, the program instructions process data by accessing data in memory, modifying the data and storing the modified data into memory.

Processors may be programmed to perform a wide variety of functions in software. In some cases, however, dedicated hardware may be included in a processor that significantly eases the processing load needed to perform certain functions. This allows the use of lower performance processor for these functions, which lowers the cost of the processor. One type of dedicated hardware that may advantageously be included in a processor is power control hardware. Power control hardware provides the capability to control circuitry and devices that use significant amounts of power. For example, power control hardware may be used to control motors, power supplies, etc.

One common mode of operation of power control hardware is pulse width modulation (PWM). In PWM, the power level is controlled by controlling the duty cycle of a signal that has only two states—active and inactive. The signal is then integrated in a device, such as a motor or a capacitor, to yield the equivalent of a continuously varying voltage and current.

When PWM hardware is included in a processor, external switching devices, such as transistors, must be used in order to handle significant amounts of power. These switching devices have less than perfect switching characteristics, especially when connected to devices such as motors. Problems arise with conventional PWM hardware, which has been included in current processors, in dealing with the less than perfect switching characteristics of connected switching devices.

A need arises for a technique that provides an improved ability to deal with the less than perfect switching characteristics of external switching devices that are connected to PWM hardware included in a processor.

SUMMARY OF THE INVENTION

The present invention is a processor that has pulse width modulation generation circuitry that provides an improved ability to deal with the less than perfect switching characteristics of external switching devices that are connected to PWM hardware included in a processor. This is accomplished by providing complementary PWM output signals that have a deadtime delay, which is a delay between the inactivation of one signal and the activation of the complementary signal. The deadtime provides the capability to deal with the switching characteristics of external switching devices. Advantageously, the present invention provides dual deadtime capability. That is the delay between the inactivation of the first signal and the activation of the second signal may be different than the delay between the inactivation of the second signal and the activation of the first signal. This provides an improved capability to deal with non-symmetric switching characteristics of the external switching devices, and the circuitry to which they are connected.

According to one embodiment of the present invention, a dual deadtime pulse width modulation generator for a processor includes deadtime generation circuitry operable to generate a first pulse width modulated signal and a second pulse width modulated signal complementary to the first pulse width modulated signal, wherein there is a first delay between inactivation of the first pulse width modulated signal and activation of the second pulse width modulated signal, a second delay between inactivation of the second pulse width modulated signal and activation of the first pulse width modulated signal, and the first and second delays are not equal.

In one aspect of the present invention, the first delay and the second delay may be independently settable.

According to one embodiment of the present invention, a dual deadtime pulse width modulation generator for a processor includes pulse width modulation generation circuitry operable to generate a first pulse width modulated signal, and deadtime generation circuitry including first circuitry operable to generate a second pulse width modulated signal from the first pulse width modulated signal and a third pulse width modulated signal from the first pulse width modulated signal, the third pulse width modulated signal complementary to the second pulse width modulated signal, and second circuitry operable to generate a first delay between inactivation of the second pulse width modulated signal and activation of the third pulse width modulated signal and a second delay between inactivation of the third pulse width modulated signal and activation of the second pulse width modulated signal, wherein the first and second delays are not equal.

In one aspect of the present invention, the second circuitry may include a first register operable to store a value for setting the first delay and a second register operable to store a value for setting the second delay. The second circuitry may further include a first edge detector operable to detect a first edge of the first pulse width modulated signal and initiate generation of the first delay and a second edge detector operable to detect a second edge of the first pulse width modulated signal and initiate generation of the second delay.

In one aspect of the present invention, the deadtime generation circuitry may further include third circuitry operable to generate a first clock signal that is input to the second circuitry for generating the first and second delays. The third circuitry may include a prescaler operable to generate the first clock signal by prescaling a second clock signal. The third circuitry may further include circuitry operable to set the prescaler to a first prescale setting to generate the first clock signal for generating the first delay and to set the prescaler to a second prescale setting to generate the first clock signal for generating the second delay.

According to one embodiment of the present invention, a processor includes deadtime generation circuitry operable to generate a first pulse width modulated signal and a second pulse width modulated signal complementary to the first pulse width modulated signal, wherein there is a first delay between inactivation of the first pulse width modulated signal and activation of the second pulse width modulated signal, a second delay between inactivation of the second pulse width modulated signal and activation of the first pulse width modulated signal, and the first and second delays are not equal.

In one aspect of the present invention, the first delay and the second delay may be independently settable.

According to one embodiment of the present invention, a processor includes pulse width modulation generation circuitry operable to generate a first pulse width modulated signal, and deadtime generation circuitry including first circuitry operable to generate a second pulse width modulated signal from the first pulse width modulated signal and a third pulse width modulated signal from the first pulse width modulated signal, the third pulse width modulated signal complementary to the second pulse width modulated signal, and second circuitry operable to generate a first delay between inactivation of the second pulse width modulated signal and activation of the third pulse width modulated signal and a second delay between inactivation of the third pulse width modulated signal and activation of the second pulse width modulated signal, wherein the first and second delays are not equal.

In one aspect of the present invention, the second circuitry may include a first register operable to store a value for setting the first delay and a second register operable to store a value for setting the second delay. The second circuitry may further include a first edge detector operable to detect a first edge of the first pulse width modulated signal and initiate generation of the first delay and a second edge detector operable to detect a second edge of the first pulse width modulated signal and initiate generation of the second delay.

In one aspect of the present invention, the deadtime generation circuitry may further include third circuitry operable to generate a first clock signal that is input to the second circuitry for generating the first and second delays. The third circuitry may include a prescaler operable to generate the first clock signal by prescaling a second clock signal. The third circuitry may further include circuitry operable to set the prescaler to a first prescale setting to generate the first clock signal for generating the first delay and to set the prescaler to a second prescale setting to generate the first clock signal for generating the second delay.

DETAILED DESCRIPTION

Figure 1:
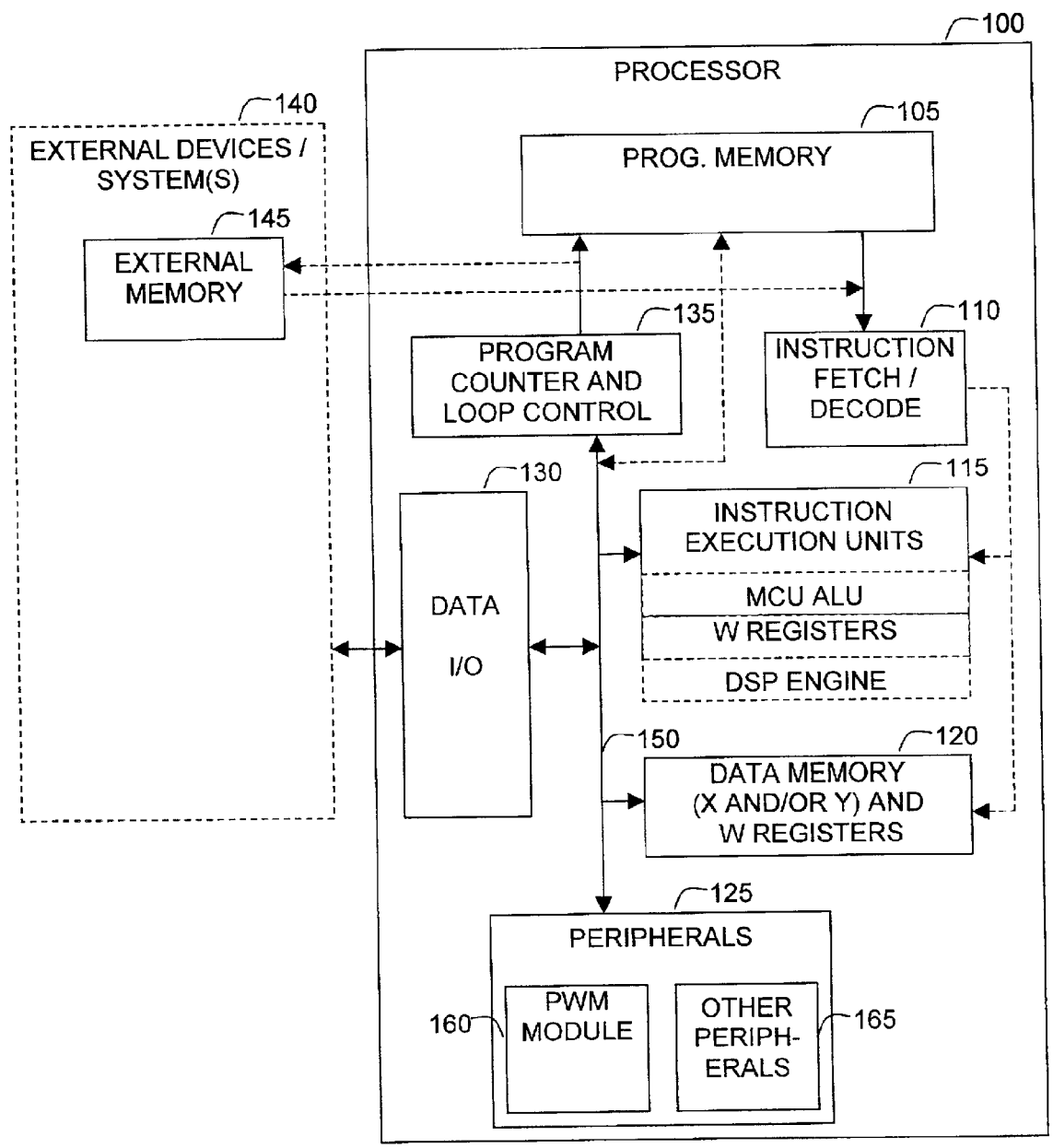
FIG. 1 depicts a functional block diagram of an embodiment of a processor chip within which the present invention may find application.

FIG. 1 depicts a functional block diagram of an embodiment of a processor chip within which the present invention may find application. Referring to FIG. 1, a processor 100 is coupled to external devices/systems 140. The processor 100 may be any type of processor including, for example, a digital signal processor (DSP), a microprocessor, a microcontroller, or combinations thereof. The external devices 140 may be any type of systems or devices including input/output devices such as keyboards, displays, speakers, microphones, memory, or other systems which may or may not include processors. Moreover, the processor 100 and the external devices 140 may together comprise a stand alone system.

The processor 100 includes a program memory 105, an instruction fetch/decode unit 110, instruction execution units 115, data memory and registers 120, peripherals 125, data I/O 130, and a program counter and loop control unit 135. The bus 150, which may include one or more common buses, communicates data between the units as shown.

The program memory 105 stores software embodied in program instructions for execution by the processor 100. The program memory 105 may comprise any type of nonvolatile memory such as a read only memory (ROM), a programmable read only memory (PROM), an electrically programmable or an electrically programmable and erasable read only memory (EPROM or EEPROM) or flash memory. In addition, the program memory 105 may be supplemented with external nonvolatile memory 145 as shown to increase the complexity of software available to the processor 100. Alternatively, the program memory may be volatile memory, which receives program instructions from, for example, an external non-volatile memory 145. When the program memory 105 is nonvolatile memory, the program memory may be programmed at the time of manufacturing the processor 100 or prior to or during implementation of the processor 100 within a system. In the latter scenario, the processor 100 may be programmed through a process called in circuit serial programming.

The instruction fetch/decode unit 110 is coupled to the program memory 105, the instruction execution units 115, and the data memory 120. Coupled to the program memory 105 and the bus 150 is the program counter and loop control unit 135. The instruction fetch/decode unit 110 fetches the instructions from the program memory 105 specified by the address value contained in the program counter 135. The instruction fetch/decode unit 110 then decodes the fetched instructions and sends the decoded instructions to the appropriate execution unit 115. The instruction fetch/decode unit 110 may also send operand information including addresses of data to the data memory 120 and to functional elements that access the registers.

The program counter and loop control unit 135 includes a program counter register (not shown) which stores an address of the next instruction to be fetched. During normal instruction processing, the program counter register may be incremented to cause sequential instructions to be fetched. Alternatively, the program counter value may be altered by loading a new value into it via the bus 150. The new value may be derived based on decoding and executing a flow control instruction such as, for example, a branch instruction. In addition, the loop control portion of the program counter and loop control unit 135 may be used to provide repeat instruction processing and repeat loop control as further described below.

The instruction execution units 115 receive the decoded instructions from the instruction fetch/decode unit 110 and thereafter execute the decoded instructions. As part of this process, the execution units may retrieve one or two operands via the bus 150 and store the result into a register or memory location within the data memory 120. The execution units may include an arithmetic logic unit (ALU) such as those typically found in a microcontroller. The execution units may also include a digital signal processing engine, a floating point processor, an integer processor, or any other convenient execution unit.

The data memory and registers 120 are volatile memory and are used to store data used and generated by the execution units. The data memory 120 and program memory 105 are preferably separate memories for storing data and program instructions respectively. This format is a known generally as a Harvard architecture. It is noted, however, that according to the present invention, the architecture may be a Von-Neuman architecture or a modified Harvard architecture, which permits the use of some program space for data space. A dotted line is shown, for example, connecting the program memory 105 to the bus 150. This path may include logic for aligning data reads from program space such as, for example, during table reads from program space to data memory 120.

A plurality of peripherals 125 on the processor may be coupled to the bus 125. The peripherals may include pulse width modulation (PWM) module 160 and other peripherals 165, such as analog to digital converters, timers, bus interfaces and protocols such as, for example, the controller area network (CAN) protocol or the Universal Serial Bus (USB) protocol and other peripherals. The peripherals exchange data over the bus 150 with the other units. The PWM module 160 is capable of generating multiple, synchronized pulse width modulated (PWM) outputs. The PWM module 160 may be advantageously applied to a variety of power and motion control applications, such as control of Three-Phase AC Induction Motors, Switched Reluctance (SR) Motors, Brushless DC (BLDC) Motors, and Uninterruptable Power Supplies (UPSs).

The data I/O unit 130 may include transceivers and other logic for interfacing with the external devices/systems 140. The data I/O unit 130 may further include functionality to permit in circuit serial programming of the Program memory through the data I/O unit 130.

Figure 2:
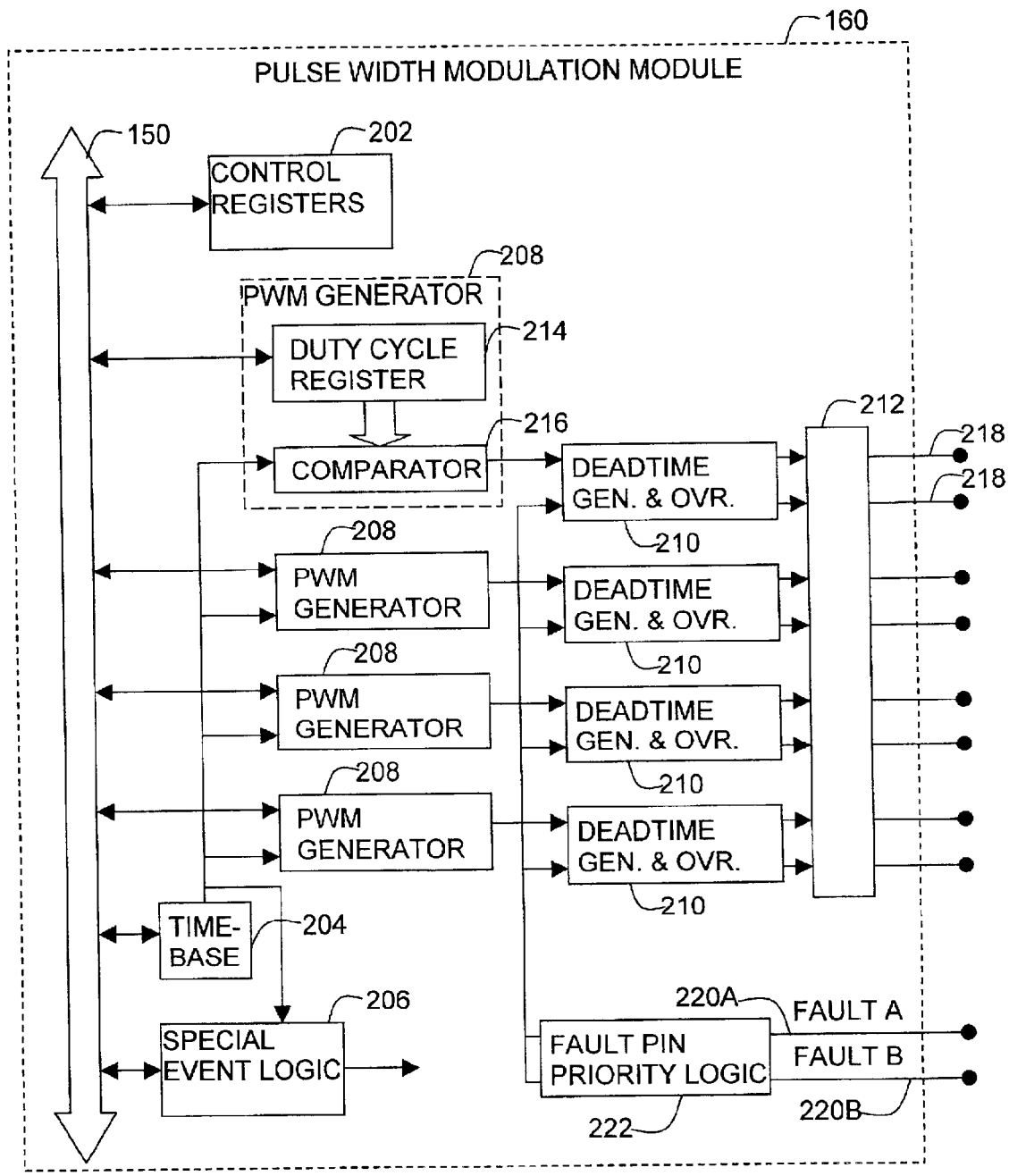
FIG. 2 depicts a functional block diagram of a pulse width modulation (PWM) module for use in a processor, such as that shown in FIG. 1.

FIG. 2 depicts a functional block diagram of a pulse width modulation (PWM) module 160, for use in a processor 100, such as that shown in FIG. 1. PWM module 160 includes control registers 202, timebase 204, special event logic 206, at least one pulse width modulation generator, such as PWM generators 208A, 208B, 208C, and 208D, for each PWM generator, a deadtime generator, such as deadtime generators 210A, 210B, 210C, and 210D, and output driver circuitry 212. Bus 150 communicates data among units of processor 100 and elements of PWM module 160. In particular, bus 150 communicates data with control registers 202, timebase 204, special event logic 206, and the at least one PWM generator, such as PWM generators 208A, 208B, 208C, and 208D.

Control registers 202 store values that are modifiable in software and provide the capability to control and configure the operation of the elements of PWM module 160. Control registers 202 may include a plurality of control registers, each control register including a plurality of bits. Each control register may be read, under software control, to determine the configuration and operational state of elements of PWM module 160. Likewise, each control register may be written, under software control, to set the configuration and control the operation of element of PWM module 160. For example, bits in control registers 202 may provide the capability to enable or disable the generation of PWM signals by PWM module 160. Bits in control register 202 may provide the capability to set the polarity and timing of signals output by PWM module 160, such as the frequency, duty cycle, and dead time of such signals. Bits in control registers 202 may provide the capability to enable, disable, and configure special event triggering, fault triggering, override operation, and other functions of PWM module 160.

Timebase 204 generates timing signals that are used by other elements of PWM module 160, such as special event logic 206 and the PWM generators 206A–D. Timebase 204 may include registers, counters, comparators, and other circuitry that operate with a timing clock signal to provide the capability to generate timing signals having programmable parameters. For example, timebase 204 may provide the capability to program parameters such as: the count direction of included counters, the resolution and prescaling of the timing clock used to generate the timebase signals, the mode of operation of timebase interrupts, postscaling of timebase signals, and the mode of operations of the timebase, such as continuous, free running, single shot, etc.

Special event logic 206 generates trigger signals that provide the capability to synchronize operations external to PWM module 160 with the operation of PWM module 160. For example, in an embodiment of processor 100 in which other peripherals 165 includes one or more analog to digital (A/D) converters, the operation of such A/D converters may be synchronized to the operation of PWM module 160 using the trigger signals generated by special event logic 206. Special event logic 206 uses signals generated by timebase 204 to generate trigger signals that are synchronized with selected points in the period of the PWM signals generated by PWM module 160.

Each PWM generator generates a PWM signal, which is input to a deadtime generator. Each PWM generator, such as PWM generator 208A, may include a duty cycle register, such as duty cycle register 214, a comparator, such as comparator 216, and associated circuitry. Duty cycle register 214 stores a value that controls the duty cycle of the PWM signals. The duty cycle of a PWM signal is the fraction of each complete PWM cycle that the signal is in the active state. Duty cycle register 214 typically includes a buffer register, which is accessible by software, and a comparison register, which stores the actual compare value used in each PWM cycle. The value in the comparison register is compared by comparator 216, to a value generated by timebase 204. The status of this comparison controls the signals output from comparator 216, which, in turn, control whether the PWM signal is in the active or inactive state.

The output from each comparator, such as comparator 216, is input to a deadtime generator, such as deadtime generator 210A. Deadtime generator 210A may pass the signal from comparator 216 without alteration, or deadtime generator 210A may alter the signal. Deadtime generator 210A may generate a set of complementary PWM signals based on the signal from comparator 216. Complementary signals are signals that are arranged so that when one signal is active, the other signal is inactive. When the active signal becomes inactive, the inactive signal becomes active, and so on. Deadtime generator 210 also inserts deadtime into the complementary signals. Deadtime is a period during which neither complementary signal is active.

The complementary PWM signals generated by each deadtime generator, such as deadtime generator 210A, is input to output driver circuitry 212, which includes circuitry of sufficient capacity to drive circuitry external to processor 100. The drive signals are supplied to external circuitry via processor pins, such as pins 218A and 218B.

Fault inputs 220A and 220B provide the capability to drive one or more of the PWM outputs to a defined state. Such a function is useful if a fault occurs in the external circuitry that is controlled by the PWM outputs of processor 100. The function of the fault inputs is performed directly in hardware, so that fault events can be managed quickly. Examples of faults that may occur include failure of an external switching device, such as a transistor, short circuit of external circuitry or devices, such as a motor, overcurrent detected in external circuitry or devices, a fault in the power supply, etc. Fault pin priority logic 222 provides the capability to prioritize the function of the fault inputs if more than one input becomes active. The signals output from fault pin priority logic 222 are input to the deadtime generators 210A–210D. The deadtime generators also include fault override logic that overrides the function of the deadtime generator in response to a fault signal from fault pin priority logic 222, if so configured.

Included in control registers 202 are registers that control the configuration and function of PWM module 160 in response to activation of one or more fault inputs. In particular, the registers provide the capability to define whether a particular pair of PWM outputs associated with a deadtime generator, such as PWM outputs 218A and 218B and deadtime generator 210A, are controlled by the fault inputs. If enabled, the override logic in the deadtime generator will respond to a fault output signal 224 from fault pin priority logic 222 and perform a defined action.

Control registers 202 store values that define the state of each PWM output in response to a fault signal input to each fault input. Each PWM output can be defined to be driven inactive or active in response to the fault signal input to each fault input. For example, PWM output 218A may be defined to be driven inactive in response to a fault signal on fault input 220A and may be defined to be driven active in response to a fault signal on fault input 220B. If a PWM output pair associated with one deadtime generator is in the complementary output mode and both PWM outputs are defined to be driven to the active state in response to a fault signal input to a fault input, both PWM outputs would be driven active, which is not desirable. In this situation, the override logic in the deadtime generator will give priority to one PWM output, drive that PWM output active, and drive the other PWM output inactive.

Fault pin priority logic 222 provides prioritization among the fault inputs. If more than one fault input has been defined to control a particular PWM output and at least two such fault inputs become active concurrently, fault pin priority logic 222 selects one of the fault inputs to be given priority. The PWM outputs are driven to the fault states defined for the fault input that has been given priority, and the other fault inputs are ignored. Fault priority logic 222 generates a fault output signal 224 that indicates the selected fault input. Fault output signal 224 in input to the deadtime generators, such as deadtime generator 210A, which drives its associated PWM outputs to the fault state defined for the selected fault input.

Each of the fault inputs has two modes of operation:

Latched Mode: When the fault input is driven active, the PWM outputs will remain in the defined fault states until the fault input is driven inactive and the fault condition is cleared in software. The PWM outputs will be enabled for normal, non-fault operation once the fault condition is cleared in software.

Cycle-by-Cycle Mode: When the fault input is driven active, the PWM outputs will remain in the defined fault states until the fault input is driven inactive. When the fault input is driven inactive, the PWM outputs will return to normal, no-fault operation at the beginning of the next PWM period.

The mode of operation of each fault input is defined in registers included in control registers 202.

Each fault input may also be controlled directly by software. Processor 100 can be configured so that software can directly drive the active or inactive levels of each fault input.

Figure 3:
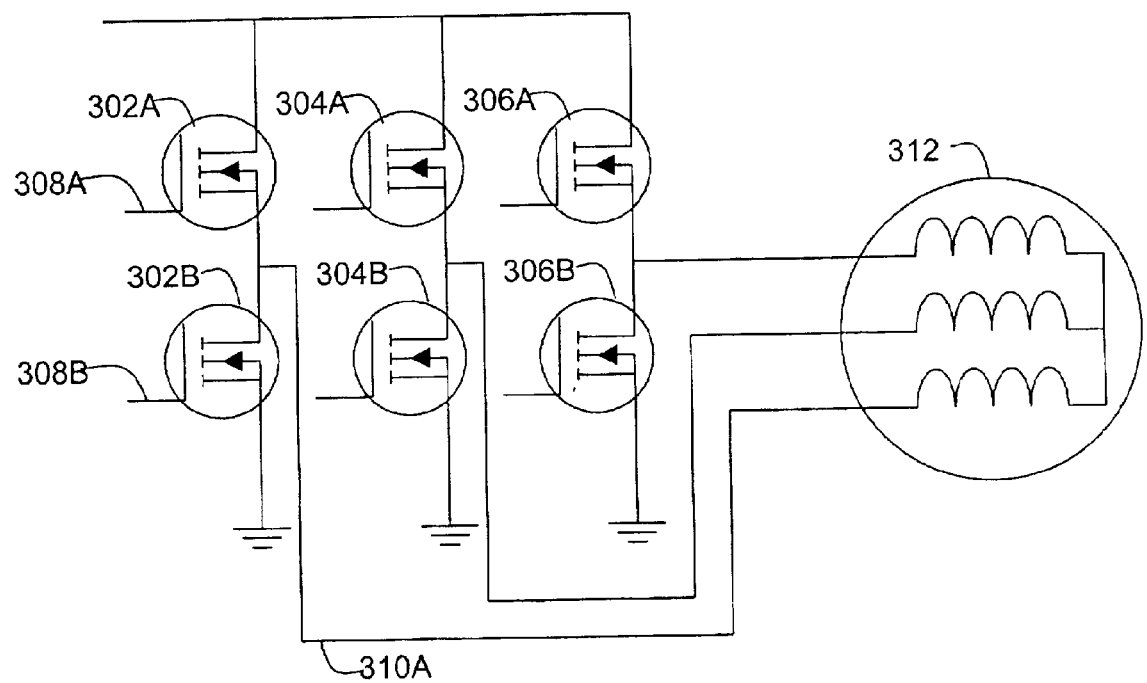
FIG. 3 depicts an exemplary external circuit, which may be driven by complementary PWM signals generated by the circuit shown in FIG. 2.

An example of an external circuit that may be driven by complementary PWM signals is shown in FIG. 3. In this example, three transistor pairs, a first pair including transistors 302A and 302B, a second pair including transistors 304A and 304B, and a third pair including transistors 306A and 306B, are connected to complementary PWM outputs of processor 100, either directly or via appropriate additional circuitry. For example, the signal on pin 218A, shown in FIG. 2, may be connected to input 308A of transistor 302A and the complementary signal on pin 218B, also shown in FIG. 2, may be connected to input 308B of transistor 302B. One of skill in the art would recognize that pins 218A and 218B would typically be connected to inputs 308A and 308B, respectively, via appropriate, and well-known, circuitry. Other complementary PWM outputs from processor 100 may similarly be connected to inputs to other transistor pairs.

The output from each transistor pair is formed at a connection between the transistors in the pair. In the example shown, which uses transistors that are MOSFETs, the output of each transistor pair is formed at the connection between the source of the upper transistor and the drain of the lower transistor. For example, output 310A is formed at the connection of the source of transistor 302A and the drain of transistor 302B. The outputs of the transistor pairs are connected to windings of motor 312 and supply of power that drives motor 312.

In the example of FIG. 3, MOSFET transistors and a three-phase AC induction motor are illustrated. One of skill in the art would, of course, recognize that other types of transistors and other types of motors could be used as well as those illustrated. For example, transistors, such as bipolar transistors, insulated-gate bipolar transistors, and other well-known types of transistors, or motors, such as switched reluctance (SR) motors, or brushless DC (BLDC) motors could be used instead of those illustrated, with well-known modifications to the circuitry. Likewise, as is well-known, the PWM signals could be used to control other applications, such as switching power supplies, etc.

Figure 4:
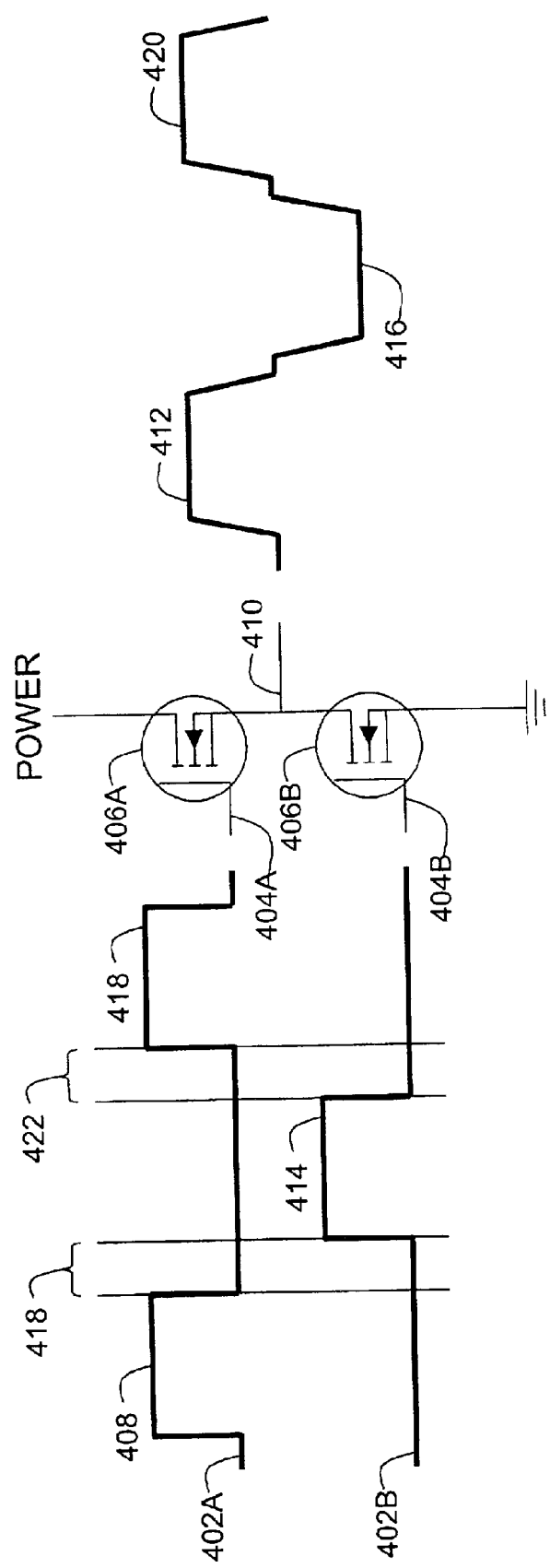
FIG. 4 illustrates the concept of deadtime in complementary PWM signals.

The concept of deadtime in complementary PWM signals is illustrated in FIG. 4. Complementary PWM signals are applied to the inputs of a transistor pair. In particular, PWM signal 402A is applied to input 404A of transistor 406A and PWM signal 402B, which is complementary to signal 402A, is applied to input 404B of transistor 406B. Signal 402A has an active period 408, during which signal 402B, being complementary, is inactive. During period 408, transistor 406A conducts and transistor 406B does not conduct, causing the output 410 from the transistor pair to output signal 412. At the end of period 408, signal 402A becomes inactive, then, in period 414, signal 402B becomes active. During period 414, transistor 406B conducts and transistor 406A does not conduct, causing the output 410 from the transistor pair to output signal 416. As is well-known, the rise and fall times of signals 402A and 402B are not infinitely fast, nor are the switching times of transistors 406A and 406B. If signal 402B were to become active immediately upon signal 402A becoming inactive, the finite rise and fall times of the signals and the finite switching times of the transistors would cause a period during which both transistor 406A and transistor 406B were conducting. During this period, current would be conducted directly from power to ground, limited only by the conduction resistances of the transistors. At a minimum, this would waste power and cause unnecessary power dissipation in the transistors. In many cases, it is possible that catastrophic failure of one or more transistors may occur.

This situation can be averted by providing a deadtime, such as deadtime 418, which is a period during which neither complementary signal is active. Thus, when signal 402A becomes inactive, a time delay occurs before signal 402B becomes active. This time delay may be determined based on the rise and fall times of signals 402A and 402B, the switching times of transistors 406A and 406B, and based on parameters of other circuit components, such as motor winding inductances, etc. The provision of a deadtime prevents the power waste, unnecessary power dissipation, and possible catastrophic failure that would otherwise occur.

At the end of period 414, signal 402B becomes inactive, then, in period 418, signal 402A becomes active. During period 418, transistor 406A conducts and transistor 406B does not conduct, causing the output 410 from the transistor pair to output signal 420. Again, a deadtime 422 is provided between the inactivation of signal 402B and the activation of signal 402A. In some embodiments, deadtime 418 may be equal in time to deadtime 422. However, in other embodiments, it is necessary that deadtime 418 have a different duration from deadtime 422. Thus, it is advantageous to provide the capability to configure deadtime 418 independently of deadtime 422.

Figure 5:
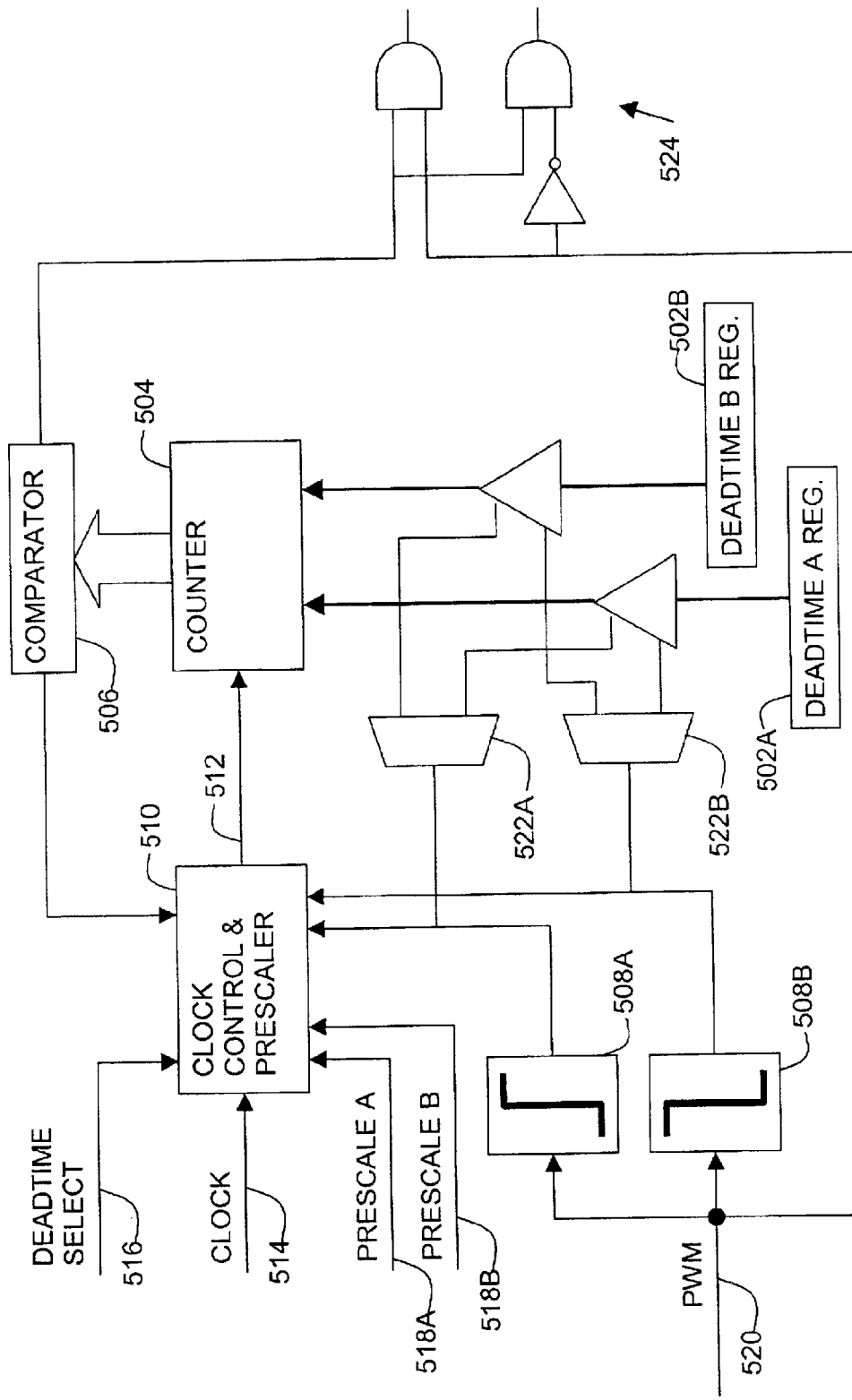
FIG. 5 depicts an exemplary block diagram of a deadtime generator circuit shown in FIG. 2.

An exemplary deadtime generator circuit 500, which is suitable for use in pulse width modulation module 106, shown in FIG. 2, is illustrated in FIG. 5. Deadtime generator 500 provide the capability to generate complementary PWM signals that have deadtimes that are independently configurable. For illustration in FIG. 5, the two deadtimes are termed deadtime A and deadtime B. Deadtime generator 500 includes two deadtime registers, deadtime A register 502A and deadtime B register 502B, counter 504, comparator 506, two edge detectors 508A and 508B, and clock control and prescaler circuitry 510. The duration of each deadtime period is selected in software by selecting an appropriate prescaler setting and an appropriate deadtime register setting. Clock control and prescaler circuitry 510 generates a prescaled clock 512 that is output to counter 504. This allows a plurality of ranges of deadtime durations to be selected. Clock control and prescaler circuitry 510 has inputs that include clock 514, deadtime select 516, and prescale selects, prescale select A 518A and prescale select B 518B. Clock 514 is typically derived from a processor or system clock and is input to the prescaler. Prescale select A 518A and prescale select B 518B provide the capability to select different prescaler setting for each deadtime. Deadtime select 516 provides the capability to select desired configurations of clock control and prescaler circuitry 510.

Deadtime A register 502A and deadtime B register 502B are settable by software and store values that control the duration of each deadtime period. Counter 504 counts cycles of the prescaled clock. 512 that is output from clock control and prescaler circuitry 510. For each deadtime period, counter 504 is loaded with the number of cycles that it is to count from either deadtime A register 502A or deadtime B register 502B. The deadtime register that is to be used for each particular load of counter 504. as well as the prescaler setting. The PWM signal 520 that is output from comparator 216 of FIG. 2 is input to edge detectors 508A and 508B. If the PWM edge event is a rising edge, the edge is detected by rising edge detector 508A, which activates circuitry 522A that loads the value stored in deadtime A register 502A into counter 504. Detection of the rising edge of signal 520 also causes prescale A setting 518A to be used by the prescaler 510. If the PWM edge event is a falling edge, the edge is detected by falling edge detector 508B, which activates circuitry 522B that loads the value stored in deadtime B register 502B into counter 504. Detection of the falling edge of signal 520 also causes prescale B setting 518B to be used by the prescaler 510.

Once a value has been loaded into counter 504 and prescaler 510 has been set, counter 504 counts cycles of prescaled clock 512 until a terminal value is reached. The terminal value is detected by comparator 506. Until the terminal value is reached, comparator 506 outputs a signal to circuitry 524, which deactivates the PWM output. When the terminal value is reached, comparator 506 outputs a signal to circuitry 524 that activates the PWM output. Note that circuitry 524 generates complementary PWM output signals from PWM signal 520.

Figure 6:
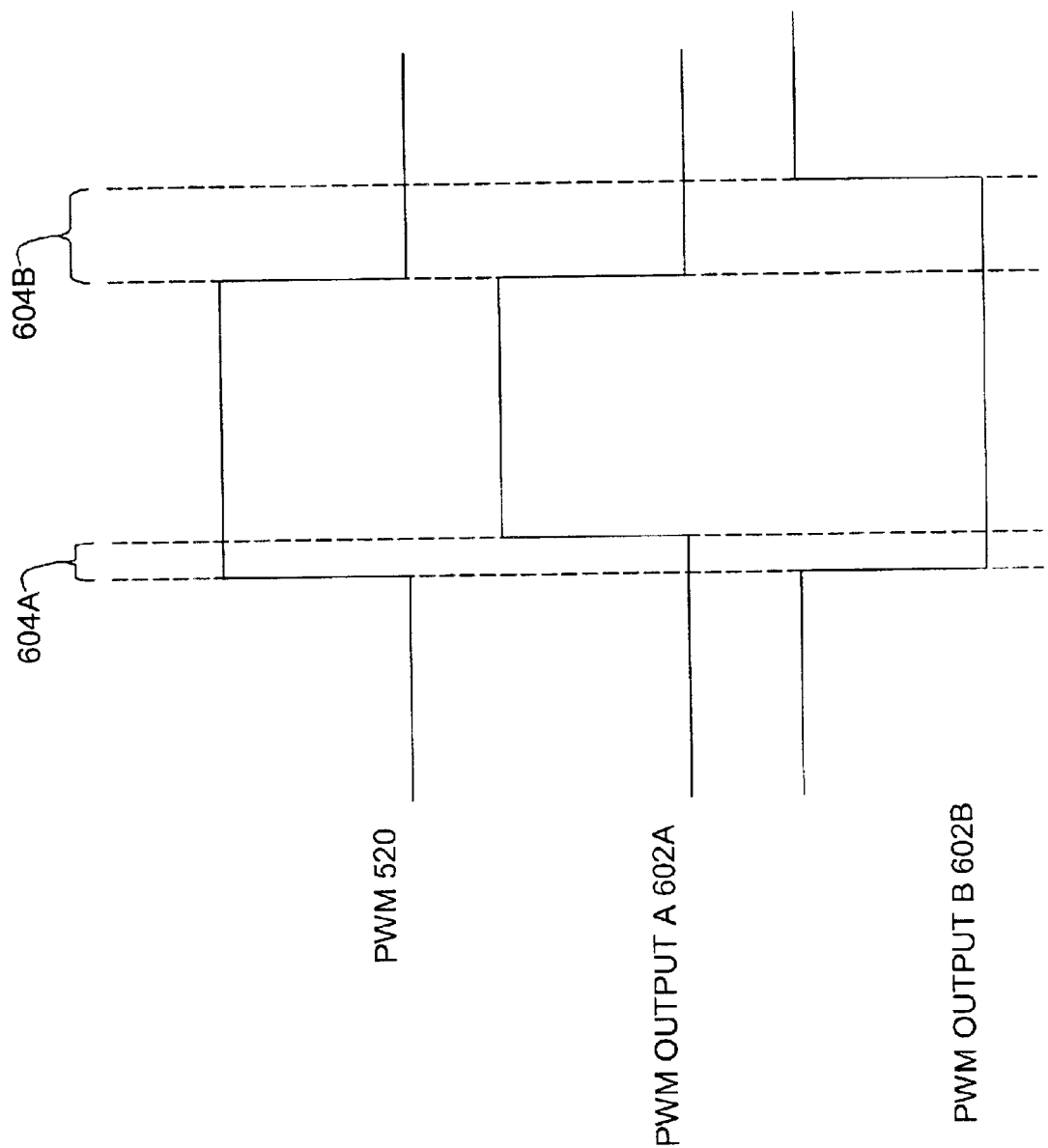
FIG. 6 illustrates the function of the deadtime generator circuit shown in FIG. 5.

The function of deadtime generator circuit 500 is illustrated in FIG. 6. The signals shown include PWM signal 520, PWM output A signal 602A, and PWM output B signal 602B. A rising edge in PWM signal 520 causes deadtime A 604A to be inserted in PWM output A signal 602A before signal 602A becomes active. No delay is inserted before PWM output B signal 602B becomes inactive. A falling edge in PWM signal 520 causes deadtime B 604B to be inserted in PWM output B signal 602B before signal 602B becomes active. No delay is inserted before PWM output A signal 602A becomes inactive.

While specific embodiments of the present invention have been illustrated and described, it will be understood by those having ordinary skill in the art that changes may be made to those embodiments without departing from the spirit and scope of the invention.

What is claimed is:

1. A dual deadtime pulse width modulation generator for a processor comprising:

deadtime generation circuitry operable to generate a first pulse width modulated signal and a second pulse width modulated signal complementary to the first pulse width modulated signal, wherein there is a first delay between inactivation of the first pulse width modulated signal and activation of the second pulse width modulated signal, a second delay between inactivation of the second pulse width modulated signal and activation of the first pulse width modulated signal, and the first and second delays are not equal.

2. The dual deadtime pulse width modulation generator of claim 1, wherein the first delay and the second delay are independently settable.

3. A dual deadtime pulse width modulation generator for a processor comprising:

pulse width modulation generation circuitry operable to generate a first pulse width modulated signal; and deadtime generation circuitry comprising:

first circuitry operable to generate a second pulse width modulated signal from the first pulse width modulated signal and a third pulse width modulated signal from the first pulse width modulated signal, the third pulse width modulated signal complementary to the second pulse width modulated signal, and second circuitry operable to generate a first delay between inactivation of the second pulse width modulated signal and activation of the third pulse width modulated signal and a second delay between inactivation of the third pulse width modulated signal and activation of the second pulse width modulated signal, wherein the first and second delays are not equal.

4. The dual deadtime pulse width modulation generator of claim 3, wherein the second circuitry comprises a first register operable to store a value for setting the first delay and a second register operable to store a value for setting the second delay.

5. The dual deadtime pulse width modulation generator of claim 4, wherein the second circuitry further comprises a first edge detector operable to detect a first edge of the first pulse width modulated signal and initiate generation of the first delay and a second edge detector operable to detect a second edge of the first pulse width modulated signal and initiate generation of the second delay.

6. The dual deadtime pulse width modulation generator of claim 5, wherein the deadtime generation circuitry further comprises third circuitry operable to generate a first clock signal that is input to the second circuitry for generating the first and second delays.

7. The dual deadtime pulse width modulation generator of claim 6, wherein the third circuitry comprises a prescaler operable to generate the first clock signal by prescaling a second clock signal.

8. The dual deadtime pulse width modulation generator of claim 7, wherein the third circuitry further comprises circuitry operable to set the prescaler to a first prescale setting to generate the first clock signal for generating the first delay and to set the prescaler to a second prescale setting to generate the first clock signal for generating the second delay.

9. A processor comprising:

deadtime generation circuitry operable to generate a first pulse width modulated signal and a second pulse width modulated signal complementary to the first pulse width modulated signal, wherein there is a first delay between inactivation of the first pulse width modulated signal and activation of the second pulse width modulated signal, a second delay between inactivation of the second pulse width modulated signal and activation of the first pulse width modulated signal, and the first and second delays are not equal.

10. The processor of claim 9, wherein the first delay and the second delay are independently settable.

11. A processor comprising:

pulse width modulation generation circuitry operable to generate a first pulse width modulated signal; and deadtime generation circuitry comprising:

first circuitry operable to generate a second pulse width modulated signal from the first pulse width modulated signal and a third pulse width modulated signal from the first pulse width modulated signal, the third pulse width modulated signal complementary to the second pulse width modulated signal, and second circuitry operable to generate a first delay between inactivation of the second pulse width modulated signal and activation of the third pulse width modulated signal and a second delay between inactivation of the third pulse width modulated signal and activation of the second pulse width modulated signal, wherein the first and second delays are not equal.

12. The processor of claim 11, wherein the second circuitry comprises a first register operable to store a value for setting the first delay and a second register operable to store a value for setting the second delay.

13. The processor of claim 12, wherein the second circuitry further comprises a first edge detector operable to detect a first edge of the first pulse width modulated signal and initiate generation of the first delay and a second edge detector operable to detect a second edge of the first pulse width modulated signal and initiate generation of the second delay.

14. The processor of claim 13, wherein the deadtime generation circuitry further comprises third circuitry operable to generate a first clock signal that is input to the second circuitry for generating the first and second delays.

15. The processor of claim 14, wherein the third circuitry comprises a prescaler operable to generate the first clock signal by prescaling a second clock signal.

16. The processor of claim 15, wherein the third circuitry further comprises circuitry operable to set the prescaler to a first prescale setting to generate the first clock signal for generating the first delay and to set the prescaler to a second prescale setting to generate the first clock signal for generating the second delay.

* * * * *